(12) United States Patent
Wu et al.

(10) Patent No.: US 12,340,729 B2
(45) Date of Patent: Jun. 24, 2025

(54) SWITCH DEVICES AND DISPLAY APPARATUSES

(71) Applicant: TCL CHINA STAR OPTOELECTRONICS TECHNOLOGY CO., LTD., Guangdong (CN)

(72) Inventors: Yongfeng Wu, Guangdong (CN); Wenfang Li, Guangdong (CN); Haoran Li, Guangdong (CN)

(73) Assignee: TCL CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 311 days.

(21) Appl. No.: 18/176,199

(22) Filed: Feb. 28, 2023

(65) Prior Publication Data

US 2023/0206822 A1 Jun. 29, 2023

Related U.S. Application Data

(63) Continuation of application No. PCT/CN2020/137659, filed on Dec. 18, 2020.

(30) Foreign Application Priority Data

Dec. 1, 2020 (CN) .......................... 202011387743.0

(51) Int. Cl.
*G09G 3/32* (2016.01)
*G09G 3/20* (2006.01)
(Continued)

(52) U.S. Cl.
CPC ............. *G09G 3/2096* (2013.01); *G09G 3/32* (2013.01); *H02M 3/156* (2013.01); *H03K 3/012* (2013.01);
(Continued)

(58) Field of Classification Search
CPC ...... G09G 3/20; G09G 3/2014; G09G 3/2092; G09G 3/2096; G09G 3/30; G09G 3/32;
(Continued)

(56) References Cited

U.S. PATENT DOCUMENTS 5,608,339 A 3/1997 Fujiwara
2009/0243577 A1 10/2009 Lim
(Continued)

FOREIGN PATENT DOCUMENTS

CN 101868091 A 10/2010
CN 102665325 A 9/2012
(Continued)

OTHER PUBLICATIONS

International Search Report in International application No. PCT/CN2020/137659, mailed on Jul. 29, 2021.
(Continued)

*Primary Examiner* — Thienvu V Tran
*Assistant Examiner* — Shahzeb K Ahmad
(74) *Attorney, Agent, or Firm* — PV IP PC; Wei Te Chung

(57) ABSTRACT

A switch device includes: a switch circuit; a control signal input terminal configured to input a control signal to the switch circuit; a voltage input terminal configured to input an initial voltage to the switch circuit; and a voltage output terminal configured to output an output voltage to a light-emitting device. The switch circuit includes: a first input terminal and a second input terminal electrically connected to the control signal input terminal and the voltage input terminal, respectively; and a first output terminal electrically connected to the voltage output terminal.

18 Claims, 3 Drawing Sheets

(51) Int. Cl.
  *H02M 3/156* (2006.01)
  *H03K 3/012* (2006.01)
  *H03K 17/687* (2006.01)
  *H05B 45/30* (2020.01)

(52) U.S. Cl.
  CPC ......... *H03K 17/6872* (2013.01); *H05B 45/30* (2020.01); *G09G 3/2014* (2013.01); *G09G 2300/0809* (2013.01); *G09G 2310/08* (2013.01); *G09G 2330/021* (2013.01)

(58) Field of Classification Search
  CPC ......... G09G 3/3208; G09G 2300/0809; G09G 2310/08; G09G 2330/021; G09G 2330/027; H02M 1/32; H02M 1/38; H02M 3/155; H02M 3/156; G05F 1/59; H03K 3/012; H04K 17/6872; H05B 45/30
  See application file for complete search history.

(56) References Cited

U.S. PATENT DOCUMENTS

| | | | |
|---|---|---|---|
| 2013/0038365 | A1 | 2/2013 | Gao et al. |
| 2013/0069553 | A1 | 3/2013 | Lin et al. |
| 2015/0200608 | A1 | 7/2015 | Lin et al. |
| 2019/0305768 | A1* | 10/2019 | Willard ............... H01L 25/0657 |
| 2020/0076182 | A1* | 3/2020 | Huang ..................... G09G 3/36 |
| 2020/0259491 | A1* | 8/2020 | Oota .................. H03K 17/6871 |

FOREIGN PATENT DOCUMENTS

| | | | | |
|---|---|---|---|---|
| CN | 103354086 | A * | 10/2013 | ....... G02F 1/133603 |
| CN | 103377631 | A | 10/2013 | |
| CN | 204131399 | U * | 1/2015 | |
| CN | 105871180 | A | 8/2016 | |
| CN | 205751476 | U | 11/2016 | |
| CN | 206099771 | U | 4/2017 | |
| CN | 108076561 | A | 5/2018 | |
| CN | 108924995 | A | 11/2018 | |
| CN | 109493778 | A * | 3/2019 | ............... G09G 3/20 |
| JP | 2004088820 | A | 3/2004 | |
| JP | 2011186641 | A | 9/2011 | |

OTHER PUBLICATIONS

Written Opinion of the International Search Authority in International application No. PCT/CN2020/137659, mailed on Jul. 29, 2021.

Chinese Office Action issued in corresponding Chinese Patent Application No. 202011387743.0 dated Dec. 27, 2021, pp. 1-7.

Chinese Notification to Grant Patent Right for Invention issued in corresponding Chinese Patent Application No. 202011387743.0 dated Apr. 1, 2022, pp. 1-3.

* cited by examiner

SWITCH DEVICES AND DISPLAY APPARATUSES

CROSS-REFERENCE TO RELATED APPLICATIONS

This application is a continuation of International Application No. PCT/CN2020/137659, filed on Dec. 18, 2020, which claims priority to Chinese Patent Application No. 202011387743.0, filed on Dec. 1, 2020. The disclosures of the aforementioned applications are incorporated herein by reference in their entireties.

TECHNICAL FIELD

The present disclosure relates to power supply, and in particular, to switch devices and display apparatuses.

BACKGROUND

Generally, in display apparatus, it is necessary to input to a light-emitting device a direct current (DC) voltage capable of turning on the light-emitting device to emit light. In the related art, a constant DC voltage is continuously input to the light-emitting device to achieve emitting light by the light-emitting device, which may result in large undesired power consumption.

SUMMARY

In view of the above, an embodiment of the present disclosure provides a switch device including a control signal input terminal, a voltage input terminal, a switch circuit, and a voltage output terminal;
  wherein the control signal input terminal is configured to input a control signal to the switch circuit, and the control signal is a square wave signal;
  the voltage input terminal is configured to input an initial voltage to the switch circuit, and the initial voltage is a constant voltage;
  the voltage output terminal is electrically connected to a light-emitting device, and configured to output an output voltage to the light-emitting device;
  the switch circuit includes a first input terminal, a second input terminal and a first output terminal, the first input terminal and the second input terminal are electrically connected to the control signal input terminal and the voltage input terminal, respectively; the first output terminal is electrically connected to the voltage output terminal; and the switch circuit is configured such that the output voltage from the voltage output terminal is controlled by the control signal;
  the switch circuit further includes a first metal-oxide-semiconductor (MOS) transistor, a second MOS transistor, a first resistor, and a second resistor;
  a gate of the first MOS transistor is electrically connected to a first node, a source of the first MOS transistor is electrically connected to the second input terminal, and a drain of the first MOS transistor is electrically connected to a second node;
  a gate of the second MOS transistor is electrically connected to the first node, a source of the second MOS transistor is electrically connected to a ground terminal, and a drain of the second MOS transistor is electrically connected to the second node;
  two ends of the first resistor are electrically connected to the second input terminal and the second node, respectively;
  two ends of the second resistor are electrically connected to the ground terminal and the second node, respectively;
  the first node is electrically connected to the first input terminal;
  the second node is electrically connected to the first output terminal; and
  the light-emitting device is a mini light-emitting diode or a micro light-emitting diode.

An embodiment of the present disclosure provides a switch device including a control signal input terminal, a voltage input terminal, a switch circuit, and a voltage output terminal;
  wherein the control signal input terminal is configured to input a control signal to the switch circuit, and the control signal is a square wave signal;
  the voltage input terminal is configured to input an initial voltage to the switch circuit, and the initial voltage is a constant voltage;
  the voltage output terminal is electrically connected to a light-emitting device, and configured to output an output voltage to the light-emitting device; and
  the switch circuit includes a first input terminal, a second input terminal and a first output terminal, the first input terminal and the second input terminal are electrically connected to the control signal input terminal and the voltage input terminal, respectively; the first output terminal is electrically connected to the voltage output terminal; and the switch circuit is configured such that the output voltage from the voltage output terminal is controlled by the control signal.

An embodiment of the present disclosure provides a display apparatus including a switch device according to any one of the above implementations, wherein the switch device includes a control signal input terminal, a voltage input terminal, a switch circuit, and a voltage output terminal;
  the control signal input terminal is configured to input a control signal to the switch circuit, and the control signal is a square wave signal;
  the voltage input terminal is configured to input an initial voltage to the switch circuit, and the initial voltage is a constant voltage;
  the voltage output terminal is electrically connected to a light-emitting device, and configured to output an output voltage to the light-emitting device; and
  the switch circuit includes a first input terminal, a second input terminal and a first output terminal, the first input terminal and the second input terminal are electrically connected to the control signal input terminal and the voltage input terminal, respectively; the first output terminal is electrically connected to the voltage output terminal; and the switch circuit is configured such that the output voltage from the voltage output terminal is controlled by the control signal.

DETAILED DESCRIPTION

Some embodiments of the present disclosure will be described in detail with reference to the accompanying drawings.

In order to enable any person skilled in the art to implement and use the present disclosure, the following description is given. In the following description, the details are listed for the purpose of explanation. It should be understood that those of ordinary skill in the art can realize that the present disclosure can also be implemented without using these specific details. In other instances, well-known structures and processes will not be elaborated to avoid unnecessary details to obscure the description of the present disclosure. Therefore, the present disclosure is not limited to the illustrated embodiments, but is consistent with the widest scope that conforms to the principles and features disclosed in the present disclosure.

Figure 1:
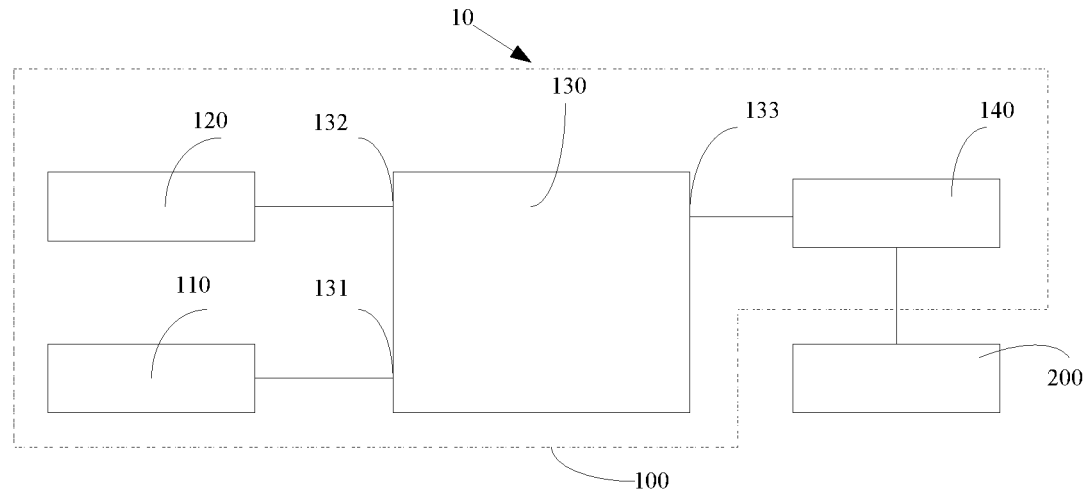
FIG. 1 is a schematic diagram of an overall structure of a switch device according to an embodiment of the present disclosure.

As shown in FIG. 1, an embodiment of the present disclosure provides a switch device 100, including a control signal input terminal 110, a voltage input terminal 120, a switch circuit 130, and a voltage output terminal 140.

The control signal input terminal 110 is configured to output a control signal Vi to the switch circuit 130, wherein the control signal Vi is a square wave signal.

The voltage input terminal 120 is configured to input an initial voltage Vcc to the switch circuit 130, wherein the initial voltage Vcc is a constant voltage.

The voltage output terminal 140 is electrically connected to a light-emitting device 200, and configured to output an output voltage Vo to the light-emitting device 200.

The switch circuit 130 includes a first input terminal 131, a second input terminal 132, and a first output terminal 133. The first input terminal 131 and the second input terminal 132 are electrically connected to the control signal input terminal 110 and the voltage input terminal 120, respectively. The first output terminal 133 is electrically connected to the voltage output terminal 140. The switch circuit 130 is configured to control the voltage of the voltage output terminal 140 under the control of the control signal, so as to turn on or off the switch circuit 130 and the light-emitting device 200.

The operation principle of the switch device 100 according to the embodiment of the present disclosure is as follows: the voltage input terminal 120 supplies a voltage to the light-emitting device 200, and the control signal input terminal 110 controls the operating state (ON or OFF) of the voltage output terminal 140; the control signal input terminal 110 controls the switching frequency of the on state and the off state of the switch circuit 130 according to the switching frequency of the high level and the low level of the square wave signal, thereby controlling the switching frequency of the on state and the off state of the voltage output terminal 140, i.e., controlling timings of the on-state and the off-state of the voltage output terminal 140.

In the embodiment of the present disclosure, the control signal input terminal 110, the voltage input terminal 120, the voltage output terminal 140, and the switch circuit 130 are provided. The control signal input terminal 110 outputs the square wave signal to control the operation state of the voltage output terminal 140, to control timings of the on-state and the off-state of the voltage output terminal 140, thereby preventing the light-emitting device 200 from continuously operating at the initial voltage Vcc and thus reducing the undesired power consumption.

Figure 2:
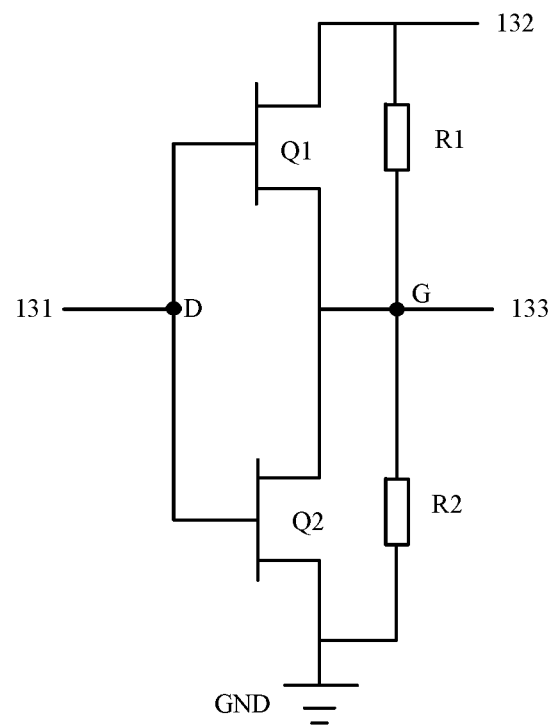
FIG. 2 is a schematic diagram of a first structure of a switch circuit according to an embodiment of the present disclosure.

Referring to a first structure of a switch circuit 130 as shown in FIG. 2 according to an embodiment of the present disclosure, the switch circuit 130 includes a first MOS (Metal-Oxide-Semiconductor) transistor Q1, a second MOS transistor Q2, a first resistor R1, and a second resistor R2.

A gate of the first MOS transistor Q1 is electrically connected to a first node D, a source of the first MOS transistor Q1 is electrically connected to the second input terminal 132, and a drain of the first MOS transistor Q1 is electrically connected to a second node G.

A gate of the second MOS transistor Q2 is electrically connected to the first node D, a source of the second MOS transistor Q2 is electrically connected to a ground terminal GND, and a drain of the second MOS transistor Q2 is electrically connected to the second node G.

Two ends of the first resistor R1 are electrically connected to the second input terminal 132 and the second node G, respectively.

Two ends of the second resistor R2 are electrically connected to the ground terminal GND and the second node G, respectively.

The first node D is electrically connected to the first input terminal 131.

The second node G is electrically connected to the first output terminal 133.

The use of the first resistor R1 may protect the first MOS transistor Q1, and the use of the second resistor R2 may protect the second MOS transistor Q2. This is because when the first MOS transistor Q1 or the second MOS transistor Q2 is turned on, the current can be limited to avoid excessive current passing through the first MOS transistor Q1 or the second MOS transistor Q2, thereby preventing damage of the first MOS transistor Q1 or the second MOS transistor Q2.

Specifically, the operation principle of the switch circuit 130 in the above embodiment is described as follows:

When the control signal output from the control signal input terminal 110 is at a high level, the voltage of the first node D is at the high level, the first MOS transistor Q1 is turned off, and the second MOS transistor Q2 is turned on. The voltage of the second node G is equal to the source voltage of the second MOS transistor Q2. Since the source of the second MOS transistor Q2 is grounded, the source voltage of the second MOS transistor Q2 is 0 V, and the voltage output from the first output terminal 133 is 0 V.

When the control signal output from the control signal input terminal 110 is at a low level, the voltage of the first node D is at the low level, the first MOS transistor Q1 is turned on, and the second MOS transistor Q2 is turned off. The voltage of the second node G is equal to the source voltage of the first MOS transistor Q1. Since the source of the first MOS transistor Q1 is electrically connected to the voltage input terminal 120, the source voltage of the first MOS transistor Q1 is the initial voltage Vcc, and the voltage output from the first output terminal 133 is the initial voltage Vcc.

Further, the first MOS transistor Q1 is a P-type MOS transistor, and the second MOS transistor Q2 is an N-type MOS transistor.

The operation principle of the N-type MOS transistor is that when a voltage difference between the gate voltage and the source voltage of the N-type MOS transistor is greater than a threshold voltage, the N-type MOS transistor is turned on. The operation principle of the P-type MOS transistor is that when a voltage difference between the gate voltage and the source voltage of the P-type MOS transistor is less than a threshold voltage, the P-type MOS transistor is turned on.

It is to be understood that the first MOS transistor Q1 and the second MOS transistor Q2 in the embodiments of the present disclosure are not limited only to MOS transistors, but may also be devices having the same function.

Figure 3:
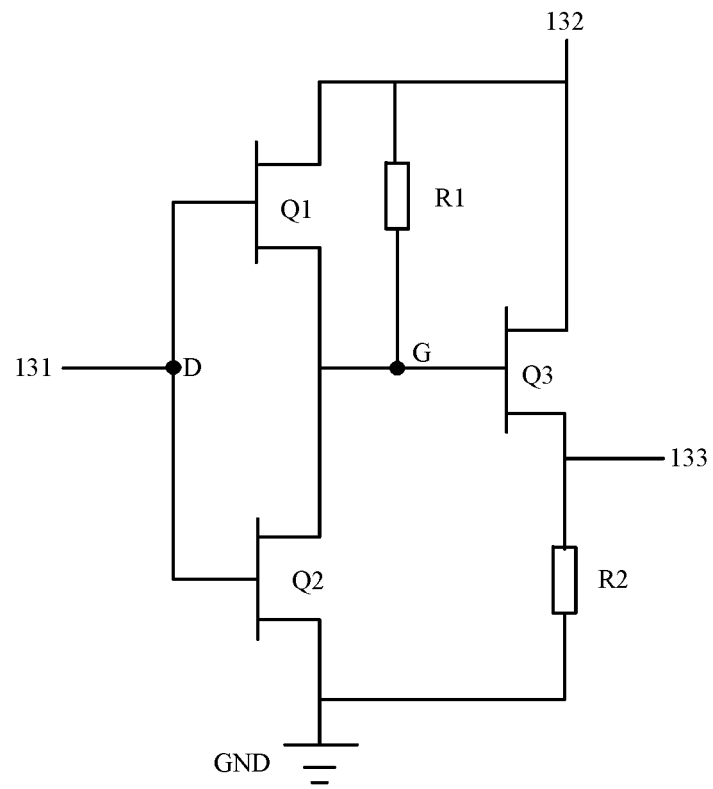
FIG. 3 is a schematic diagram of a second structure of a switch circuit according to an embodiment of the present disclosure.

Further, referring to a second structure of a switch circuit 130 as shown in FIG. 3 according to an embodiment of the present disclosure, the switch circuit 130 further includes a third MOS transistor Q3. A gate of the third MOS transistor Q3 is electrically connected to the second node G, a source of the third MOS transistor Q3 is electrically connected to the second input terminal 132, and a drain of the third MOS transistor Q3 is electrically connected to the first output terminal 133 and the second resistor R2. Other circuit configurations are the same as those in the previous embodiment, and details are not described herein.

It is to be noted that the third MOS transistor Q3 is an N-type MOS transistor or a P-type MOS transistor. In an embodiment of the present disclosure, the third MOS transistor Q3 is the P-type MOS transistor.

Specifically, the operation principle of the switch circuit 130 in the above embodiment is described as follows:

When the control signal output from the control signal input terminal 110 is at a high level, the voltage of the first node D is at the high level, the first MOS transistor Q1 is turned off, and the second MOS transistor Q2 is turned on. The voltage of the second node G is equal to the source voltage of the second MOS transistor Q2. Since the source of the second MOS transistor Q2 is grounded, the voltage of the second node G is 0 V. The third MOS transistor Q3 is turned on, and the output voltage Vo of the first output terminal 133 is equal to the source voltage of the third MOS transistor Q3. Since the source of the third MOS transistor Q3 is electrically connected to the second input terminal 132, the voltage output from the first output terminal 133 is the initial voltage Vcc.

When the control signal output from the control signal input terminal 110 is at a low level, the voltage of the first node D is at the low level, the first MOS transistor Q1 is turned on, and the second MOS transistor Q2 is turned off. The voltage of the second node G is equal to the source voltage of the first MOS transistor Q1. Since the source of the first MOS transistor Q1 is electrically connected to the second input terminal 132, the source voltage of the first MOS transistor Q1 is the initial voltage Vcc, and the voltage of the second node G is the initial voltage Vcc. The third MOS transistor Q3 is turned off, and therefore the voltage output from the first output terminal 133 is 0V.

Figure 4:
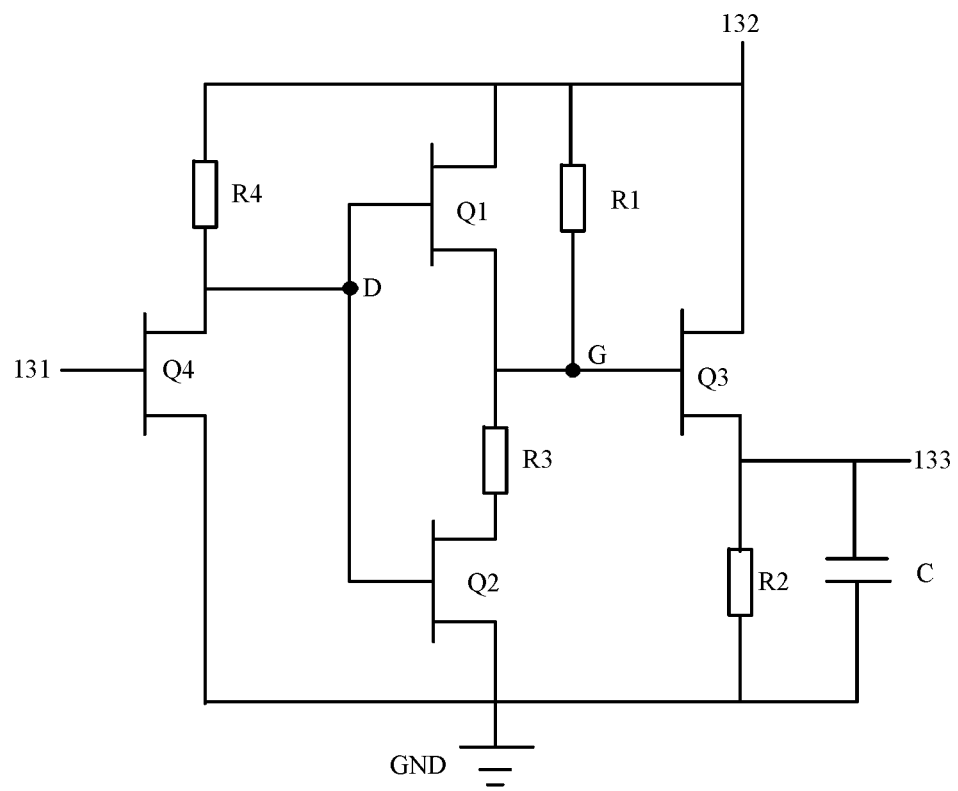
FIG. 4 is a schematic diagram of a third structure of a switch circuit according to an embodiment of the present disclosure.

Further, referring to a third structure of the switch circuit 130 as shown in FIG. 4 according to an embodiment of the present disclosure, the switch circuit 130 further includes a fourth MOS transistor Q4. A gate of the fourth MOS transistor Q4 is electrically connected to the first input terminal 131, a source of the fourth MOS transistor Q4 is electrically connected to the ground terminal GND, and a drain of the fourth MOS transistor Q4 is electrically connected to the first node D and the second input terminal 132. Other circuit configurations are the same as those in the previous embodiment, and details are not described herein.

It is noted that a polarity of the fourth MOS transistor Q4 is opposite to that of the third MOS transistor Q3. In an embodiment of the present disclosure, the fourth MOS transistor Q4 is a N-type MOS transistor.

Figure 5:
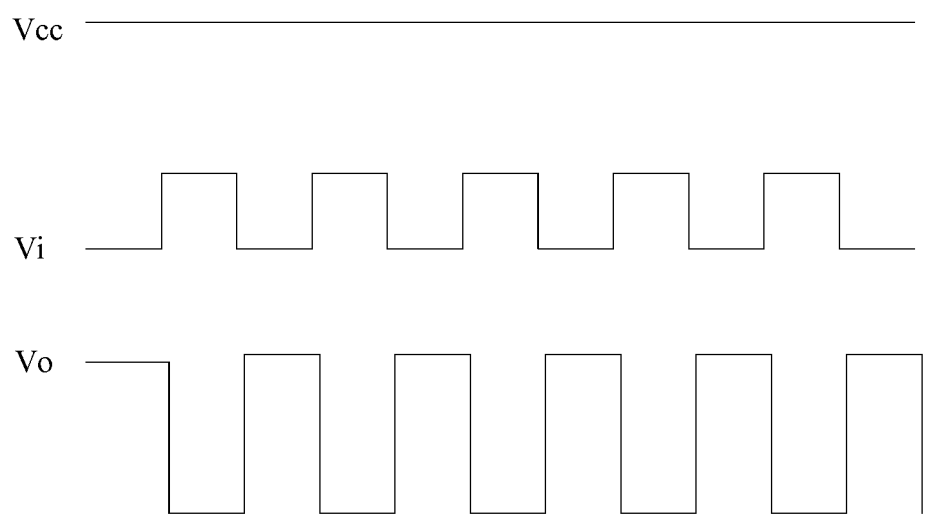
FIG. 5 is a schematic diagram of signal variations of a switch circuit according to an embodiment of the present disclosure.

Specifically, in conjunction with FIG. 5, the operation principle of the switch circuit 130 in the above embodiment is described as follows:

When the control signal output from the control signal input terminal 110 is at a high level, the fourth MOS transistor Q4 is turned on. The drain voltage of the fourth MOS transistor Q4 is equal to the source voltage thereof. Since the source of the fourth MOS transistor Q4 is electrically connected to the ground terminal GND, the voltage of the first node D is 0 V, the first MOS transistor Q1 is turned on, and the second MOS transistor Q2 is turned off. After the first MOS transistor Q1 is turned on, the voltage of the second node G is equal to the initial voltage Vcc, and the third MOS transistor Q4 is turned off. Since the drain of the third MOS transistor Q3 is electrically connected to the ground terminal GND, the voltage output from the first output terminal 133 is 0V.

When the control signal output from the control signal input terminal 110 is at a low level, the fourth MOS transistor Q4 is turned off. The voltage of the first node D is the initial voltage Vcc, the first MOS transistor Q1 is turned off, and the second MOS transistor Q2 is turned on. However, because of the existence of the first resistor R1, the gate voltage of the third MOS transistor Q3 is less than 24V, and the third MOS transistor Q3 is turned on. Therefore, the voltage output from the first output terminal 133 is the initial voltage Vcc.

The switch circuit 130 in each of the above three embodiments can convert the initial voltage Vcc to the square wave voltage, which reduces the undesired power consumption compared with the constant initial voltage Vcc.

Further, in order to improve the safety and reliability of the switch circuit 130, the switch circuit 130 further includes a third resistor R3 and a fourth resistor R4, as shown in FIG. 4.

The third resistor R3 is electrically connected between the second node G and the drain of the second MOS transistor Q2. By providing the third resistor R3, the current is limited when the second MOS transistor Q2 and the third MOS transistor Q3 are turned on at the same time, so that the current passing through the second MOS transistor Q2 is further reduced, and the safety and reliability of the second MOS transistor Q2 are improved.

The fourth resistor R4 is electrically connected between the drain of the fourth MOS transistor Q4 and the second input terminal 132. By providing the fourth resistor R4, the current is limited when the fourth MOS transistor Q4 is turned on, so that the current passing through the fourth MOS transistor Q4 is reduced, and the safety and reliability of the fourth MOS transistor Q4 are improved.

It is to be understood that the third MOS transistor Q3 and the fourth MOS transistor Q4 in the embodiments of the present disclosure are not limited to only MOS transistors, but may also be devices having the same function.

Further, as shown in FIG. 4, the switch circuit 130 further includes a capacitor C, two ends of which are electrically connected to the first output terminal 133 and the ground terminal GND, respectively. The capacitor C is configured to filter the voltage signal output from the first output terminal 133, so that the voltage signal output from the first output terminal 133 is more reliable, and the switch performance of the switch device 100 is improved.

Further, in an embodiment of the present disclosure, the initial voltage Vcc is 24V, and the square wave signal has an amplitude of 5 V. A duty ratio of the square wave signal is not limited herein, and it is only necessary to meet that the duty ratio of the square wave signal is sufficient for the light-emitting device 200 to emit light normally.

It is to be noted that in other embodiments of the present disclosure, the switch circuit 130 may not include the third MOS transistor Q3.

Here, the duty ratio of the square wave signal refers to the proportion of the high-level time relative to the total time in one pulse cycle.

It is to be further noted that in some other embodiments of the present disclosure, the switch circuit 130 may include not only the four MOS transistors described above, but also other MOS transistors, provided that the initial voltage input in the second input terminal is converted into the square wave voltage.

An embodiment of the present disclosure further provides a display apparatus 10, including the switch device 100 in any of the above embodiments.

In an embodiment of the present disclosure, the display apparatus 10 includes the light-emitting device 200 electrically connected to the switch device 100.

The light-emitting device 200 may be a mini light-emitting diode (Mini-LED). Certainly, the light-emitting device 200 may be other than Mini-LED, such as a Micro-LED.

In summary, in the embodiments of the present disclosure, by providing the control signal input terminal 110, the voltage input terminal 120, the voltage output terminal 140, and the switch circuit 130, the control signal input terminal 110 can output the square wave signal to control the operation state of the voltage output terminal 140, to control timings of the on-state and the off-state of the control voltage output terminal 140, thereby preventing the light-emitting device 200 from continuously operating at the initial voltage and thus reducing the undesired power consumption. Meanwhile, the reliability and safety of the switch circuit 130 are improved by disposing the first resistor R1, the second resistor R2, the third resistor R3 and the fourth resistor R4.

The switch device and the display apparatus according to the present disclosure are described in detail above. It is to be understood that the exemplary embodiments described herein are to be considered as illustrative only, for purposes of assisting in understanding the core idea of the present disclosure, and not for purposes of limiting the present disclosure. The description of features or aspects in each exemplary embodiment should generally be considered to apply to similar features or aspects in other exemplary embodiments. Although the present disclosure has been described with reference to exemplary embodiments, various variations and modifications may be suggested to those skilled in the art. The present disclosure is intended to encompass such variations and modifications which fall within the scope of the appended claims. Any modifications, replacements, and improvements made within the spirit and principles of the present disclosure are intended to be included within the scope of the present disclosure.

What is claimed is:

1. A switch device, comprising a control signal input terminal, a voltage input terminal, a switch circuit, and a voltage output terminal,
   wherein the control signal input terminal is configured to input a control signal to the switch circuit, and the control signal is a square wave signal;
   the voltage input terminal is configured to input an initial voltage to the switch circuit, and the initial voltage is a constant voltage;
   the voltage output terminal is electrically connected to a light-emitting device and configured to output an output voltage to the light-emitting device;
   the switch circuit comprises a first input terminal, a second input terminal and a first output terminal; the first input terminal and the second input terminal are electrically connected to the control signal input terminal and the voltage input terminal, respectively; the first output terminal is electrically connected to the voltage output terminal; and the switch circuit is configured such that the output voltage from the voltage output terminal is controlled by the control signal;
   the switch circuit further comprises a first metal-oxide-semiconductor (MOS) transistor, a second MOS transistor, a first resistor, and a second resistor;
   a gate of the first MOS transistor is electrically connected to a first node, a source of the first MOS transistor is electrically connected to the second input terminal, and a drain of the first MOS transistor is electrically connected to a second node;
   a gate of the second MOS transistor is electrically connected to the first node, a source of the second MOS transistor is electrically connected to a ground terminal, and a drain of the second MOS transistor is electrically connected to the second node;
   two ends of the first resistor are electrically connected to the second input terminal and the second node, respectively;
   two ends of the second resistor are electrically connected to the ground terminal and the second node, respectively;
   the first node is electrically connected to the first input terminal;
   the second node is electrically connected to the first output terminal; and
   the light-emitting device is a mini light-emitting diode or a micro light-emitting diode.

2. The switch device according to claim 1, wherein the first MOS transistor is a P-type MOS transistor, and the second MOS transistor is an N-type MOS transistor.

3. The switch device according to claim 2, wherein the switch circuit further comprises a third MOS transistor, a gate of the third MOS transistor is electrically connected to the second node, a source of the third MOS transistor is electrically connected to the second input terminal, and a drain of the third MOS transistor is electrically connected to the first output terminal and the second resistor.

4. The switch device according to claim 3, wherein the switch circuit further comprises a fourth MOS transistor, a gate of the fourth MOS transistor is electrically connected to the first input terminal, a source of the fourth MOS transistor is electrically connected to the ground terminal, and a drain of the fourth MOS transistor is electrically connected to the first node and the second input terminal.

5. The switch device according to claim 4, wherein the third MOS transistor is an N-type MOS transistor or a P-type MOS transistor, and a polarity of the fourth MOS transistor is opposite to a polarity of the third MOS transistor.

6. The switch device according to claim 5, wherein the switch circuit further comprises a third resistor and a fourth resistor;
   the third resistor is electrically connected between the second node and the drain of the second MOS transistor; and the fourth resistor is electrically connected between the drain of the fourth MOS transistor and the second input terminal.

7. The switch device according to claim 6, wherein the switch circuit further comprises a capacitor, and two ends of the capacitor are electrically connected to the first output terminal and the ground terminal, respectively.

8. The switch device according to claim 1, wherein the initial voltage is 24 V, and the square wave signal has an amplitude of 5 V.

9. A switch device, comprising a control signal input terminal, a voltage input terminal, a switch circuit, and a voltage output terminal, wherein the control signal input terminal is configured to input a control signal to the switch circuit, and the control signal is a square wave signal; the voltage input terminal is configured to input an initial voltage to the switch circuit, and the initial voltage is a constant voltage; the voltage output terminal is electrically connected to a light-emitting device and configured to output an output voltage to the light-emitting device; and the switch circuit comprises a first input terminal, a second input terminal and a first output terminal; the first input terminal and the second input terminal are electrically connected to the control signal input terminal and the voltage input terminal, respectively; the first output terminal is electrically connected to the voltage output terminal; and the switch circuit is configured such that the output voltage from the voltage output terminal is controlled by the control signal-, wherein the switch circuit further comprises a first MOS transistor, a second MOS transistor, a first resistor, and a second resistor; a gate of the first MOS transistor is electrically connected to a first node, a source of the first MOS transistor is electrically connected to the second input terminal, and a drain of the first MOS transistor is electrically connected to a second node; a gate of the second MOS transistor is electrically connected to the first node, a source of the second MOS transistor is electrically connected to a ground terminal, and a drain of the second MOS transistor is electrically connected to the second node; two ends of the first resistor are electrically connected to the second input terminal and the second node, respectively; two ends of the second resistor are electrically connected to the ground terminal and the second node, respectively; the first node is electrically connected to the first input terminal; and the second node is electrically connected to the first output terminal.

10. The switch device according to claim 9, wherein the first MOS transistor is a P-type MOS transistor, and the second MOS transistor is an N-type MOS transistor.

11. The switch device according to claim 10, wherein the switch circuit further comprises a third MOS transistor, a gate of the third MOS transistor is electrically connected to the second node, a source of the third MOS transistor is electrically connected to the second input terminal, and a drain of the third MOS transistor is electrically connected to the first output terminal and the second resistor.

12. The switch device according to claim 11, wherein the switch circuit further comprises a fourth MOS transistor, a gate of the fourth MOS transistor is electrically connected to the first input terminal, a source of the fourth MOS transistor is electrically connected to the ground terminal, and a drain of the fourth MOS transistor is electrically connected to the first node and the second input terminal.

13. The switch device according to claim 12, wherein the third MOS transistor is an N-type MOS transistor or a P-type MOS transistor, and a polarity of the fourth MOS transistor is opposite to a polarity of the third MOS transistor.

14. The switch device according to claim 13, wherein the switch circuit further comprises a third resistor and a fourth resistor;
the third resistor is electrically connected between the second node and the drain of the second MOS transistor; and
the fourth resistor is electrically connected between the drain of the fourth MOS transistor and the second input terminal.

15. The switch device according to claim 14, wherein the switch circuit further comprises a capacitor, and two ends of the capacitor are electrically connected to the first output terminal and the ground terminal, respectively.

16. The switch device according to claim 9, wherein the initial voltage is 24 V, and the square wave signal has an amplitude of 5 V.

17. A display apparatus comprising a switch device, wherein the switch device comprises a control signal input terminal, a voltage input terminal, a switch circuit, and a voltage output terminal; the control signal input terminal is configured to input a control signal to the switch circuit, and the control signal is a square wave signal; the voltage input terminal is configured to input an initial voltage to the switch circuit, and the initial voltage is a constant voltage; the voltage output terminal is electrically connected to a light-emitting device and configured to output an output voltage to the light-emitting device; and the switch circuit comprises a first input terminal, a second input terminal and a first output terminal; the first input terminal and the second input terminal are electrically connected to the control signal input terminal and the voltage input terminal, respectively; the first output terminal is electrically connected to the voltage output terminal; and the switch circuit is configured such that the output voltage from the voltage output terminal is controlled by the control signal-, wherein the switch circuit further comprises a first MOS transistor, a second MOS transistor, a first resistor, and a second resistor; a gate of the first MOS transistor is electrically connected to a first node, a source of the first MOS transistor is electrically connected to the second input terminal, and a drain of the first MOS transistor is electrically connected to a second node; a gate of the second MOS transistor is electrically connected to the first node, a source of the second MOS transistor is electrically connected to a ground terminal, and a drain of the second MOS transistor is electrically connected to the second node; two ends of the first resistor are electrically connected to the second input terminal and the second node, respectively; two ends of the second resistor are electrically connected to the ground terminal and the second node, respectively; the first node is electrically connected to the first input terminal; and the second node is electrically connected to the first output terminal.

18. The display apparatus according to claim 17, wherein the first MOS transistor is a P-type MOS transistor, and the second MOS transistor is an N-type MOS transistor.

* * * * *